(12) United States Patent
Na et al.

(10) Patent No.: US 10,242,879 B2
(45) Date of Patent: Mar. 26, 2019

(54) METHODS AND APPARATUS FOR FORMING SMOOTH AND CONFORMAL COBALT FILM BY ATOMIC LAYER DEPOSITION

(71) Applicant: Lam Research Corporation, Fremont, CA (US)

(72) Inventors: Jeong-Seok Na, Fremont, CA (US); Raashina Humayun, Los Altos, CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 15/492,976

(22) Filed: Apr. 20, 2017

(65) Prior Publication Data

US 2018/0308701 A1 Oct. 25, 2018

(51) Int. Cl.
| | |
|---|---|
| *H01L 21/44* | (2006.01) |
| *H01L 21/285* | (2006.01) |
| *H01L 21/768* | (2006.01) |
| *C23C 16/52* | (2006.01) |
| *C23C 16/455* | (2006.01) |

(52) U.S. Cl.
CPC .. *H01L 21/28556* (2013.01); *C23C 16/45544* (2013.01); *C23C 16/52* (2013.01); *H01L 21/76877* (2013.01)

(58) Field of Classification Search
CPC ......... H01L 21/28556; H01L 21/76877; C23C 16/45544; C23C 16/52
See application file for complete search history.

(56) References Cited

U.S. PATENT DOCUMENTS

| | | |
|---|---|---|
| 7,858,510 B1 | 12/2010 | Banerji et al. |
| 8,586,473 B1 | 11/2013 | Tanwar et al. |
| | (Continued) | |

FOREIGN PATENT DOCUMENTS

| | | |
|---|---|---|
| CN | 102224574 A | 10/2011 |
| WO | WO 2014/105477 A1 | 7/2014 |

OTHER PUBLICATIONS

U.S. Notice of Allowance dated May 29, 2015 issued U.S. Appl. No. 14/171,483.

(Continued)

*Primary Examiner* — Victor A Mandala
*Assistant Examiner* — Colleen E Snow
(74) *Attorney, Agent, or Firm* — Weaver Austin Villeneuve & Sampson LLP (57) ABSTRACT

Provided herein are atomic layer deposition (ALD) methods of depositing cobalt in a feature. The methods involve two-step surface treatments during an ALD cycle, with one step involving the reaction of a co-reactant gas with an adsorbed cobalt precursor and the other step involving a growth-inhibiting reactant gas on the cobalt surface. The growth-inhibiting reactant gas significantly lowers cobalt growth rate, producing a highly conformal cobalt film. The described ALD processes enable improved controllability in film nucleation, step coverage, and morphology by the separate surface treatment and low process temperature. The methods are applicable to a variety of feature fill applications including the fabrication of metal gate/contact fill in front end of line (FEOL) processes as well as via/line fill in back end of line (BEOL) processes.

19 Claims, 8 Drawing Sheets

(56) References Cited

U.S. PATENT DOCUMENTS

| | | | |
|---|---|---|---|
| 9,153,482 | B2 | 10/2015 | Knisley et al. |
| 9,349,637 | B2 | 5/2016 | Na et al. |
| 9,514,983 | B2 | 12/2016 | Jezewski et al. |
| 9,748,137 | B2 | 8/2017 | Lai et al. |
| 2007/0166989 | A1 | 7/2007 | Fresco et al. |
| 2009/0053426 | A1 | 2/2009 | Lu et al. |
| 2009/0269507 | A1 | 10/2009 | Yu et al. |
| 2011/0111533 | A1 | 5/2011 | Varadarajan et al. |
| 2012/0177845 | A1 | 7/2012 | Odedra et al. |
| 2013/0260555 | A1 | 10/2013 | Zope et al. |
| 2014/0106083 | A1 | 4/2014 | Wu et al. |
| 2014/0183738 | A1 | 7/2014 | Jezewski et al. |
| 2015/0093890 | A1* | 4/2015 | Blackwell ......... H01L 21/76898 438/602 |
| 2015/0162214 | A1* | 6/2015 | Thompson ........ H01L 21/32051 438/669 |
| 2015/0221542 | A1 | 8/2015 | Knisley et al. |
| 2016/0056074 | A1 | 2/2016 | Na et al. |
| 2016/0056077 | A1 | 2/2016 | Lai et al. |

OTHER PUBLICATIONS

U.S. Office Action dated Sep. 3, 2015 issued U.S. Appl. No. 14/465,610.
U.S. Notice of Allowance dated Jan. 14, 2016 issued U.S. Appl. No. 14/465,610.
U.S. Office Action dated Nov. 1, 2016 issued in U.S. Appl. No. 14/873,152.
Hesemann et al., (2000) "The Effect of Film Thickness on Stress and Transformation Behavior in Cobalt Thin Films," *Mat. Res. Soc. Symp. Proc.*, 594:219-224.
Kakuhara, et al.,(2010) "Comparison of Lifetime Improvements in Electromigration between Ti Barrier Metal and Chemical Vapor Deposition Co Capping," *Japanese Journal of Applied Physics*, 49:04DB08, 1-5 pages.
Nogami et al., (2010) "CVD Co and its Application to Cu Damascene Interconnections," *Proceedings of the IITC*, IEEE, 3 pages.
Simone et al., (2013) "Electromigration Comparison of Selective CVD Cobalt Capping with PVD Ta(N) and CVD Cobalt Liners on 22nm-Groundrule Dual-Damascene Cu Interconnects," *Reliability Physics Symposium (IRPS), IEEE International*, p. 3F.4.1-3F.4.6; 6 pages.
Yang, et al., (Jul. 2010) "Characterization of Selectively Deposited Cobalt Capping Layers: Selectivity and Electromigration Resistance", *IEEE Electron Device Letters*, 31(7):728-730.
Yang et al., (2011) "CVD Co Capping Layers for Cu/Low-k Interconnects: Cu EM enhancement vs. Co thickness," *International Interconnect Technology Conference (IITC), IEEE International*, 3 pages.
U.S. Notice of Allowance dated Apr. 27, 2017 issued in U.S. Appl. No. 14/873,152.
Chinese First Office Action dated Dec. 12, 2017 issued in Application No. CN 201510518752.1.
Taiwanese First Office Action dated May 10, 2018 issued in Application No. TW 104103163.
Moraes, Kevin (Sep. 24, 2017) "Interconnect Scaling—Implications, Solutions," Applied Materials, 17pp [presented at SEMICON Taiwan on Sep. 15, 2017].
U.S. Appl. No. 15/492,976, filed Apr. 20, 2017, Na et al.

\* cited by examiner

High Temperature | Low Temperature with inhibitor exposure

Low temperature, no inhibitor

Low temperature, with inhibitor

METHODS AND APPARATUS FOR FORMING SMOOTH AND CONFORMAL COBALT FILM BY ATOMIC LAYER DEPOSITION

BACKGROUND

Semiconductor device fabrication often involves deposition of tungsten-containing materials to be used for horizontal interconnects, vias between adjacent metal layers, and contacts between first metal layers and devices on the silicon substrate. In a conventional deposition process, tungsten is deposited in a chemical vapor deposition (CVD) process by exposing the substrate to a tungsten-containing precursor and a reducing agent.

However, as devices shrink, features become narrower and aspect ratios increase dramatically resulting in various challenges in depositing tungsten. As a result, alternative materials are sought to fill features. Cobalt is considered a promising candidate because of its low electron mean free path and good electro-migration performance. However, current processes for depositing cobalt have various challenges including non-conformal deposition in features, which can cause one or both of overhang on a feature entrance and insufficient coverage on the bottom of the feature. Non-conformal deposition can lead to voids in the feature.

SUMMARY

Provided herein are methods of atomic layer deposition (ALD) of cobalt films and related apparatus. One aspect of the subject matter disclosed herein relates to a method of depositing cobalt in a feature. The method involves providing a substrate having one or more features, each feature having a feature opening and performing multiple cycles of to deposit a cobalt layer that is conformal to the one or more features. Each cycle includes exposing the feature to a dose of a cobalt precursor to form a layer of adsorbed cobalt precursor on the one or more features, exposing the layer of adsorbed cobalt precursor to a dose of a co-reactant to react with the layer of adsorbed cobalt precursor on the one or more features, and exposing the feature to a dose of a mixture of the co-reactant and a nitrogen-containing cobalt growth inhibitor.

In some embodiments, exposing the adsorbed cobalt precursor to the dose of the co-reactant to react with the layer of adsorbed cobalt precursor on the one or more features is performed prior to exposing the feature to the dose of the mixture of the co-reactant and the nitrogen-containing cobalt growth inhibitor.

In some embodiments, exposing the adsorbed cobalt precursor to the dose of the co-reactant to react with the layer of adsorbed cobalt precursor on the one or more features is performed after exposing the feature to the dose of the mixture of the co-reactant and the nitrogen-containing cobalt growth inhibitor.

In some embodiments, the cobalt precursor has a structure according to (I):

I where $R^1$ is $C_1$-$C_8$-alkyl, $R^2$ is $C_1$-$C_8$ alkyl, x is zero, 1 or 2; and y is zero or 1.

In some embodiments, the cobalt precursor has a structure according to (II).

II

In some embodiments, the cobalt precursor is selected from the group consisting of dicarbonyl cyclopentadienyl cobalt, cobalt carbonyl, a cobalt amidinate precursor, a cobalt diazadienyl complex, and a cobalt amidinate/guanidinate precursor.

According to various embodiments, the substrate temperature during the multiple cycles is maintained at a temperature no more than 150° C., no more than 100° C., or no more than 90° C.

In some embodiments, the cobalt layer is deposited on a barrier layer.

In some embodiments, the co-reactant is hydrogen ($H_2$). In some embodiments, the co-reactant is hydrogen ($H_2$) and the nitrogen-containing cobalt inhibitor is ammonia ($NH_3$). In some embodiments, the $NH_3$ is between 0.5% and 20% (volumetric) of the mixture, or between 0.5% and 5% (volumetric) of the mixture.

In some embodiments, each cycle further involves purging a chamber in which the substrate is housed after exposing the feature to the dose of the cobalt precursor and prior to exposing the adsorbed cobalt precursor to the dose of the co-reactant.

In some embodiments, each cycle further involves purging a chamber in which the substrate is housed after exposing the feature to the dose of a mixture of the co-reactant and the nitrogen-containing cobalt growth inhibitor.

In some embodiments, there is no purge between exposing the feature to the dose of the co-reactant and exposing the feature to the dose of the mixture of the co-reactant and the nitrogen-containing cobalt growth inhibitor.

Another aspect of the disclosure relates to a method including: (a) introducing a dose of a cobalt precursor to a process chamber, (b) after introducing the dose of the cobalt precursor, purging the process chamber, (c) after purging the process chamber, introducing a dose of a $H_2$ co-reactant, (d) after introducing the dose of the $H_2$ co-reactant, introducing a dose of a mixture of the $H_2$ co-reactant and a nitrogen-containing compound, wherein the nitrogen-containing compound is between 0.5% and 20% (volumetric) of the total of the $H_2$ co-reactant and the nitrogen-containing compound; (e) after introducing the dose of the mixture of the $H_2$ co-reactant and a nitrogen-containing compound, purging the process chamber; and repeating (a)-(e) one or more times.

Another aspect of the disclosure relates to an apparatus comprising: a process chamber; one or more gas inlets into the process chamber and associated flow-control hardware; and a controller having at least one processor and a memory, wherein the at least one processor and the memory are communicatively connected with one another, the at least one processor is at least operatively connected with the flow-control hardware, and the memory stores computer-executable instructions for: (a) introducing a dose of a cobalt precursor to the process chamber; (b) after introducing the dose of the cobalt precursor, purging the process chamber; (c) after purging the process chamber, introducing a dose of a $H_2$ co-reactant; (d) after introducing the dose of the $H_2$ co-reactant, introducing a dose of a mixture of the $H_2$ co-reactant and a nitrogen-containing compound, wherein the nitrogen-containing compound is between 0.5% and 20% (volumetric) of the total of the $H_2$ co-reactant and the nitrogen-containing compound; (e) after introducing the dose of the mixture of the $H_2$ co-reactant and a nitrogen-containing compound, purging the chamber; and repeating (a)-(e) one or more times.

These and other aspects are described further below with reference to the drawings.

DETAILED DESCRIPTION

In the following description, numerous specific details are set forth to provide a thorough understanding of the presented embodiments. The disclosed embodiments may be practiced without some or all of these specific details. In other instances, well-known process operations have not been described in detail to not unnecessarily obscure the disclosed embodiments. While the disclosed embodiments will be described in conjunction with the specific embodiments, it will be understood that it is not intended to limit the disclosed embodiments.

In semiconductor fabrication, features may be filled with conductive materials. For example, tungsten is often filled in features to form contacts, such as in front end of line (FEOL) applications. However, as devices shrink, aspect ratios increase and smaller features are used to form contacts. In many applications, an alternative conductive material, such as cobalt, may be used to form contacts or otherwise fill features.

Conventional cobalt deposition in semiconductor fabrication includes electroplating, a wet process that uses an electric current to reduce metal cations in a solution. In cobalt electroplating, a thin layer of cobalt, called a cobalt seed layer, may be first deposited in the feature. The seed layer is sufficiently conductive to allow growth of cobalt in the feature in the electroplating process.

Figure 1A:
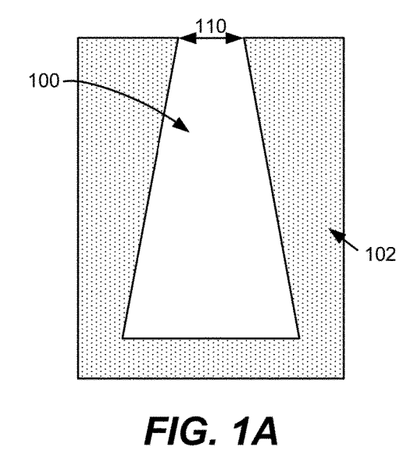
FIGS. 1A-1D are schematic illustrations of cobalt fill in features.

Cobalt may also be deposited by atomic layer deposition (ALD) or chemical vapor deposition (CVD). In conventional ALD or CVD, voids may form in the features due to the feature profile. FIG. 1A is a schematic illustration of an example of such a feature 100 in a substrate 102. The substrate may be a silicon wafer, e.g., 200-mm wafer, 300-mm wafer, 450-mm wafer, including wafers having one or more layers of material such as dielectric, conducting, or semi-conducting material deposited thereon. Features can be characterized by one or more of narrow openings, re-entrant openings, constrictions within the feature, and high aspect ratios. In some embodiments, the feature 100 may have an aspect ratio of at least about 2:1, at least about 10:1, at least about 15:1, at least about 20:1 or higher. The feature 100 may have a dimension near the opening, e.g., an opening diameter or line width, or opening width, or critical dimension, of less than about 19 nm, also known as feature widths less than 1× nm. The feature 100 can be referred to as an unfilled feature or simply a feature. The feature, and any feature, may be characterized in part by an axis that extends through the length of the feature, with vertically-oriented features having vertical axes and horizontally-oriented features having horizontal axes.

Figure 1B:
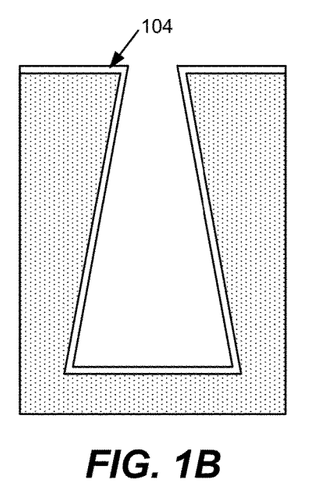
Figure 1C:
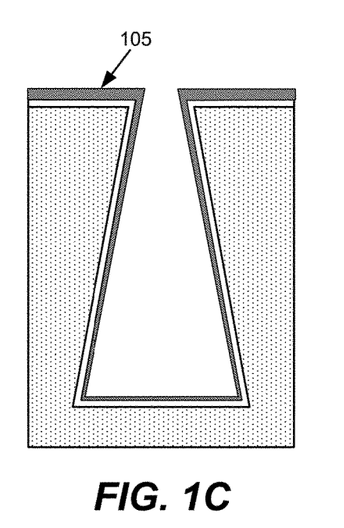
Figure 1D:
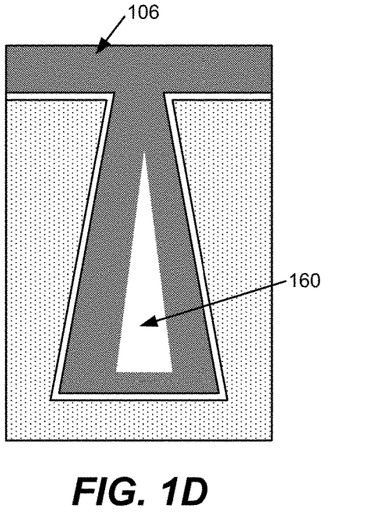

As shown, the substrate 102 includes a feature 100 having a feature opening 110 which is narrower than the width of the bottom of the feature. The feature 100 in FIG. 1A includes a re-entrant profile. A re-entrant profile is a profile that narrows from a bottom, closed end, or interior of the feature to the feature opening. According to various embodiments, the profile may narrow gradually and/or include an overhang at the feature opening. The re-entrant pattern shown in FIG. 1A may be generated by one or more of asymmetric etching kinetics during patterning and the overhang due to non-conformal film step coverage in the previous film deposition, such as deposition of a diffusion barrier. In various examples, the feature may have a width smaller in the opening at the top of the feature than the width of the bottom of the feature. FIG. 1B is a schematic illustration of a barrier layer 104 deposited into the feature 100. After a barrier layer 104 is deposited, conventional deposition of cobalt by ALD or CVD forms a non-conformal cobalt film in the feature 100. FIG. 1C is a schematic illustration of the feature 100 with a non-conformal film 105 that has overhang at the feature entrance and insufficiently thick film coverage at the bottom of the feature. In a subsequent fill process, a cobalt film 106 is formed. Due to the overhang at the feature entrance and insufficient coverage at the feature bottom, the fill process results in the formation of a void 160 within the pattern of the feature 100. A void is region in the feature that is left unfilled. A void can form, for example, when the deposited material forms a pinch point within the feature, sealing off an unfilled space within the feature preventing reactant entry and deposition. The formation of voids in features often results in device failure.

In the example of FIGS. 1A-1D, the feature opening is re-entrant, which can contribute to the poor step coverage of the non-conformal film 105. However, even in features that are not re-entrant, conventional CVD processes for depositing cobalt can result in non-conformality. The subsequent fill processes by vapor deposition or by electroplating can result in voids.

Provided herein are atomic layer deposition (ALD) methods of depositing cobalt. The methods may be used to deposit any of: cobalt seed layers for subsequent electroplating fill in features, cobalt seed layers for subsequent CVD fill in features, or for direct fill of features by ALD. The approaches described herein may be used with narrow features, such as features with sub-10 nm openings, or sub-7 nm openings. The methods involve two-step surface treatments during an ALD cycle, with one step involving the reaction of a co-reactant gas with an adsorbed cobalt precursor and the other step involving a growth-inhibiting reactant gas on the cobalt surface. The growth-inhibiting reactant gas significantly lowers cobalt growth rate, producing a highly conformal cobalt film. The described ALD processes enable improved controllability in film nucleation, step coverage, and morphology by separate surface treatment and low process temperature. The methods are applicable to a variety of feature fill applications including the fabrication of metal gate/contact fill in front end of line (FEOL) processes as well as via/line fill in back end of line (BEOL) processes.

The distribution of a material within a feature may be characterized by its step coverage. For the purposes of this description, "step coverage" is defined as a ratio of two thicknesses—the thickness of the material inside the feature divided by the thickness of the material near the opening. If measuring from a middle portion of the feature, the thickness may be measured at a position between about 25% and 75% of the distance or, in certain embodiments, between about 40% and 60% of the distance along the feature's depth measured from the feature's opening. If measuring from an end portion of the feature, the thickness may be measured at a position between about 75% and 95% of the distance along the feature's axis as measured from the opening. The terms "near the opening of the feature" and "near the feature's opening" refer to a top portion of the feature located within 25% or, more specifically, within 10% of the opening's edge or other element representative of the opening's edge. Step coverage of over 100% can be achieved, for example, by filling a feature wider in the middle or near the bottom of the feature than at the feature opening. Conformal depositions have step coverages close to 100%, e.g., 80%-120%, or 90%-110%. The methods described herein may be used to deposit cobalt conformally such that the cobalt follows the contours of the underlying surface.

Figure 2A:
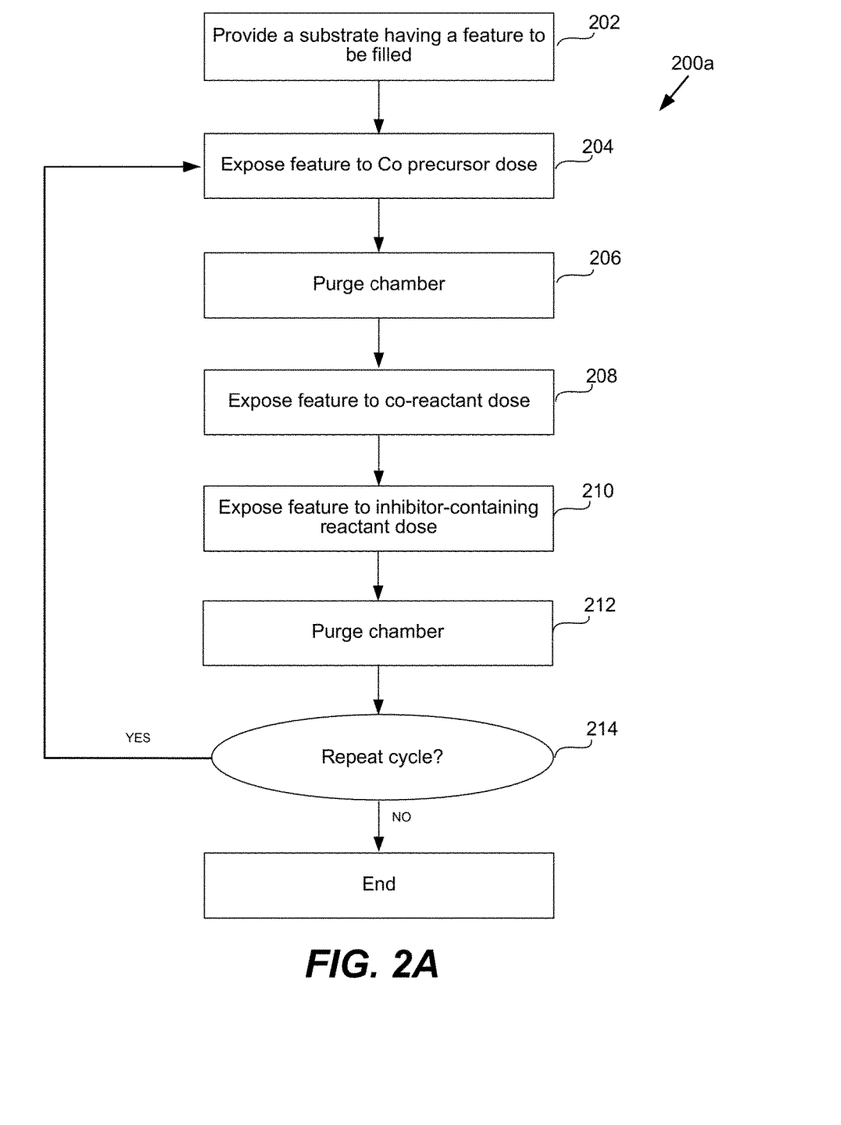
FIGS. 2A and 2B are process flow diagrams depicting methods in accordance with various embodiments.

FIG. 2A is a process flow diagram of operations for performing a method 200a in accordance with certain embodiments. In operation 202, a substrate having a feature to be filled is provided. The substrate may be a silicon substrate or another suitable semiconductor substrate. The substrate may include more than one feature, and may include a pattern of features having features of various sizes, or features of one size. For purposes of this description, FIG. 2A is discussed in the context of filling a single feature, but it should be understood that features of various sizes may also be filled similarly. Features may be any of those described above and may be formed in a dielectric or other material on the substrate. In some embodiments, a feature formed in silicon oxide or other dielectric may include a metal contact at the feature bottom and dielectric sidewalls.

In some embodiments, the feature includes one or more liner layers that conformally line the feature. The one or more liner layers may be one or both of an adhesion layer and diffusion barrier layer. Examples of barrier layers include thin layer of tungsten nitride (WN), titanium nitride (TiN), tantalum nitride (TaN), and cobalt nitride (CoN). Examples of adhesion layers include titanium (Ti). In some embodiments, the barrier film may be a tungsten carbon nitride (WCN) film. WCN barrier films are described, for example, in U.S. patent application Ser. No. 15/474,383, titled "Selective Deposition of WCN Barrier/Adhesion Layer for Interconnect," filed Mar. 30, 2017, which is incorporated by reference herein.

The substrate is generally provided to a reaction chamber, examples of which are further described below, in which the ALD deposition of the cobalt layer is performed. The below description assumes that the ALD deposition is performed in a single chamber or a single station of a multi-station chamber. However, in alternative embodiments, any of each of the exposure operations may be performed in different chambers or stations. The substrate may be provided to a chamber with or without a liner layer previously deposited in a feature.

The feature is then exposed to a cobalt precursor dose in an operation 204. Example cobalt precursors include dicarbonyl cyclopentadienyl cobalt (I), cobalt carbonyl, various cobalt amidinate precursors, cobalt diazadienyl complexes, cobalt amidinate/guanidinate precursors, and combinations thereof. Suitable cobalt precursors may include a cobalt center with organic groups and/or carbonyl groups, where organic groups include alkyls, such as methyl, ethyl, propyl, butyl, pentyl, hexyl, heptyl, and octyl, which may be straight or branched hydrocarbon chains. In some embodiments, the cobalt precursor is an organometallic compound that has a substituted or unsubstituted allyl ligand. In some embodiments, the allyl ligand is unsubstituted.

In some embodiments the cobalt precursor is an organometallic cobalt compound having the following structure:

where $R^1$ is $C_1$-$C_8$-alkyl, $R^2$ is $C_1$-$C_8$ alkyl, x is zero, 1 or 2; and y is zero or 1.

In some embodiments $R^1$ is a $C_2$-$C_8$-alkyl, $R^2$ is independently $C_2$-$C_8$ alkyl.

The term "alkyl" as used herein refers to saturated hydrocarbon chain of 1 to 8 atoms in length, such as methyl, ethyl, propyl, butyl, pentyl, hexyl, heptyl, and octyl. The term "alkyl" includes both straight and branched hydrocarbon chains. Thus, the term propyl includes both n-propyl and isopropyl. The term butyl includes both n-butyl, sec-butyl, iso-butyl, and tert-butyl.

In some embodiments x is 0 and y is 1. An example of an organometallic compound in accordance with this embodiment is shown below:

Certain described compounds are available from SAFC-Hitech of Haverhill, Mass., in conjunction with corresponding deposition apparatuses available from Lam Research Inc., of Fremont, Calif.

In some embodiments, cobalt-containing precursors include metal-organic precursors having a high vapor pressure at low temperatures, such as at temperatures less than about 100° C. An example vapor pressure may be about 0.5

Torr in an about 30° C. environment. In some embodiments, cobalt precursors such as dicobalt hexacarbonyl tert-butylacetylene (CCTBA) are not used. CCTBA has a relatively low vapor pressure at low temperatures, which can make it difficult to deposit at low temperatures and is intrinsically unstable, resulting in dimerization or polymerization over time.

In various embodiments, a suitable cobalt precursor is introduced into the chamber using a non-reactive carrier gas, such as argon (Ar). In some embodiments, the cobalt precursor is introduced to the chamber using argon as a carrier gas. The cobalt precursor is adsorbed onto the substrate such that it conformally lines the feature surface. Un-adsorbed cobalt precursor is then purged from the chamber in an operation 206. Purging can involve one or both of introducing an inert gas to sweep the chamber and a vacuum purge. The feature is then exposed to a co-reactant dose in an operation 208. The co-reactant is a compound that reacts with the adsorbed cobalt precursor to form cobalt. In the examples provided herein, the co-reactant is hydrogen ($H_2$), though other co-reactants may be used depending on the cobalt precursor chemistry. In some embodiments, the co-reactant may be introduced using a non-reactant carrier gas. The adsorbed precursor is reacted and forms cobalt metal on the feature surface.

The feature is then exposed to an inhibitor-containing reactant dose in an operation 210. The inhibitor-containing reactant dose is a nitrogen-containing dose, with examples including ammonia ($NH_3$), nitrogen ($N_2$), and hydrazine ($N_2H_2$). Other nitrogen-containing compounds may be used as cobalt growth inhibitors. Operation 210 may further involve introducing the co-reactant gas that was introduced in operation 208 along with the inhibitor-containing reactant gas. The inhibitor-containing reactant gas interacts with the cobalt (Co) and serves to inhibit cobalt growth. However, too much $NH_3$ or other inhibitor can result in unacceptably slow or stopped growth or the incorporation of nitrogen into the cobalt film. By mixing the inhibitor-containing reactant gas with the co-reactant gas, the inhibitor-containing reactant gas is dilute. Moreover, in some embodiments, there may be competition on the surface between the co-reactant and the inhibitor-containing reactant gas that also serves to mitigate the effect of the latter. In some embodiments, transitioning from operation 208 to operation 210 involves continuing to flow the co-reactant into the chamber and adding a flow of the inhibitor-containing reactant gas. The chamber is then purged in an operation 212. At block 214, if the cycle is to be repeated, the method returns to operation 204. If not, the method ends. The cycle is generally repeated until a desired thickness of cobalt is deposited. According to various embodiments, that thickness can be enough for a cobalt seed layer to support subsequent bulk vapor deposition or electroplating or can be sufficient to fill a feature. Thus, in some embodiments, after the method 200a, the feature may be only partially filled, with a subsequent CVD bulk deposition of cobalt or an electroplating operation performed to complete feature fill. In some embodiments, the feature may be filled.

Figure 2B:
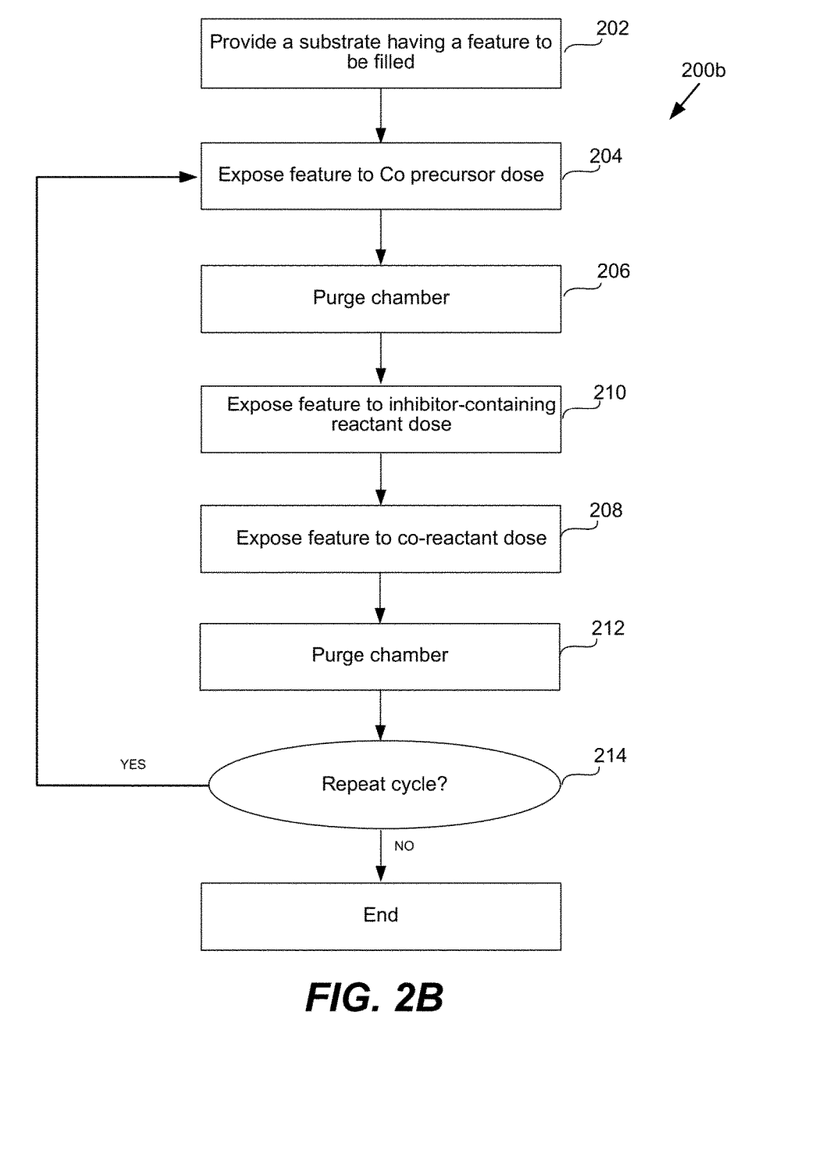

FIG. 2B is a process flow diagram of operations for performing a method 200b in accordance with certain embodiments. The method 200b differs from the method 200a discussed with reference to FIG. 2A in that exposing the substrate to the inhibitor-containing reactor dose (operation 210) is performed prior to exposing the substrate to the co-reactant dose with inhibitor (operation 208). Transitioning from operation 210 to operation 208 in the method 200b may involve shutting off a flow of the inhibitor-containing reactant gas while continuing to flow the co-reactant. During operation 210 in FIGS. 2A and 2B, the inhibitor-containing reactant dose may be 0.5% to 20% (volumetric) of the combined inhibitor-containing reactant dose and co-reactant dose. In particular embodiments, it may be 1% to 5% (volumetric).

Operations 202, 204, 206, and 212 may be performed as described above with respect to FIG. 2a. The methods 200a and 200b in FIGS. 2A and 2B are thermal, non-plasma ALD processes.

Substrate temperature during the ALD deposition is relatively low, for example, below 150° C., and in some embodiments, below 100° C. Temperature is generally no lower than 70° C. The chamber pressure may be between 5 Torr to 50 Torr and in some embodiments between 8 Torr and 20 Torr. Substrate temperature affects the step coverage such that by operating at relatively low temperatures, better step coverage can be obtained. Pressure affects film qualities such as impurity levels and resistivity. In some embodiments, pressure is at least 8 Torr to obtain highly pure cobalt films with low resistivity.

In various embodiments, the suitable cobalt-containing precursor and/or reducing agent are introduced into the chamber using a carrier gas, such as argon (Ar). Example flow rates are given below, with the understanding that the flow rates will depend on the particular deposition chamber used and may vary from the examples given.

In some embodiments, the flow rate of an Ar carrier gas or other carrier gas that carries the cobalt precursor may be between about 15 sccm and about 300 sccm, and in more particular embodiments between about 50 sccm and about 100 sccm.

During a purge operation, the Ar or other purge gas flow rate may be between 10 sccm and 50,000 sccm, and in more particular embodiments, between 500 sccm and 10,000 sccm. During a purge operation, no reactants or inhibitor gases may be flowed.

In various embodiments, the co-reactant is hydrogen ($H_2$). $H_2$ may be flowed without a carrier gas in some embodiments. The $H_2$ co-reactant may be introduced at a flow rate between about 100 sccm and about 50,000 sccm, or more particularly, between about 500 sccm and about 10,000 sccm. In some embodiments, the inhibitor gas is $NH_3$. The $NH_3$ may be introduced at a flow rate of between 5 sccm and 2,000 sccm, or more particularly, 10 sccm to 400 sccm.

The inhibitor compound is one that inhibits nucleation or adsorption of the cobalt precursor without being incorporated into the film. For the cobalt precursors shown in structures I and II, above, nitrogen-containing inhibitor compounds have been found to have an inhibiting effect. Oxygen, halogen, and other reactive species may be avoided. The inhibitor compound may be referred to as a cobalt growth inhibitor or an inhibitor.

Figure 3:
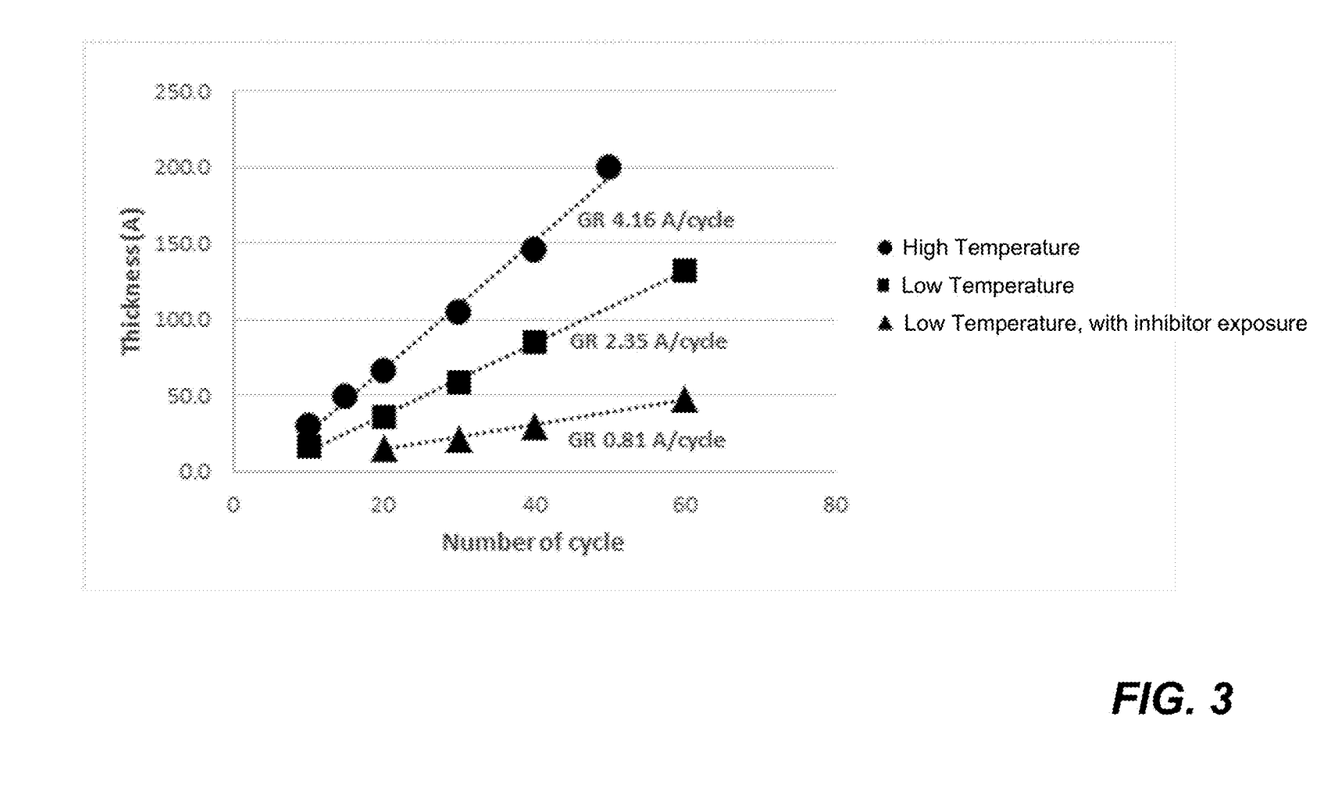
FIG. 3 is a graph showing the effect of inhibitor exposure on the ALD growth rate of cobalt.

FIG. 3 is a graph showing the effect of inhibitor exposure on the ALD growth rate of cobalt. Three ALD processes are compared: a high temperature process with no inhibitor exposure (data points marked with circles), a low temperature process with no inhibitor exposure (squares), and a low temperature process with inhibitor exposure (triangles). The high temperature process refers to a temperature in the range 100° C. to 140° C., with the low temperature processes referring to a temperature about 20-40° C. less than the high temperature process. The low temperature process with inhibitor exposure was performed according to the method 200a shown in FIG. 2A. A cobalt precursor according to structure II was used, with $H_2$ as the co-reactant and an H$_2$/NH$_3$ mixture used for inhibitor exposure. NH$_3$ was 1-2% volumetric of the H$_2$/NH$_3$ mixture.

FIG. 3 shows that growth rate is affected by temperature, with the growth rate dropping by 45% with a decreased in temperature. The inhibitor dose, however, is even more effective at slowing growth rate, with a drop of 65%. In this manner, the ALD process is slower, which results in greater conformality and step coverage.

Figure 4A:
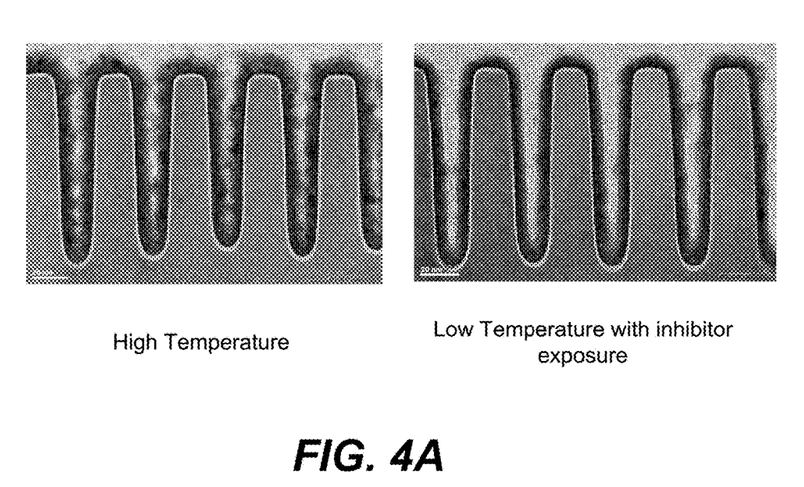
FIG. 4A shows transmission electron microscope (TEM) images of ALD cobalt films on trenches with a top critical dimension (CD) opening of 22-27 nm.
Figure 4B:
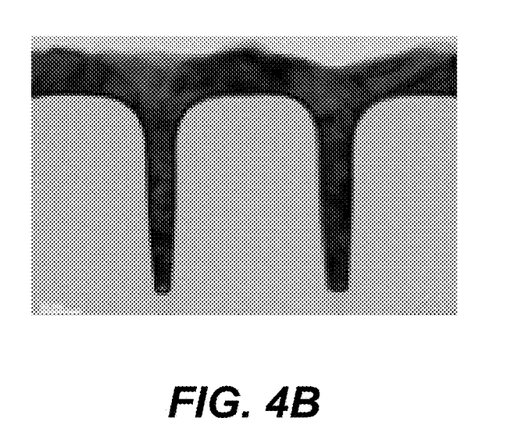
FIG. 4B shows a TEM image of cobalt gapfill using an ALD process as described above with respect to FIG. 2A.

FIG. 4A shows transmission electron microscope (TEM) images of ALD cobalt films on trenches with a top critical dimension (CD) opening of 22-27 nm. The left image shows ALD cobalt deposition using a high temperature process as described with reference to FIG. 3 and no inhibitor exposure. The right image shows ALD cobalt deposition using a low temperature process with inhibitor exposure as described with reference to FIG. 3. The film step coverage and film morphology is improved by using a lower temperature and inhibitor exposure. FIG. 4B shows a TEM image of cobalt gapfill using an ALD process as described above with respect to FIG. 2A.

Figure 5:
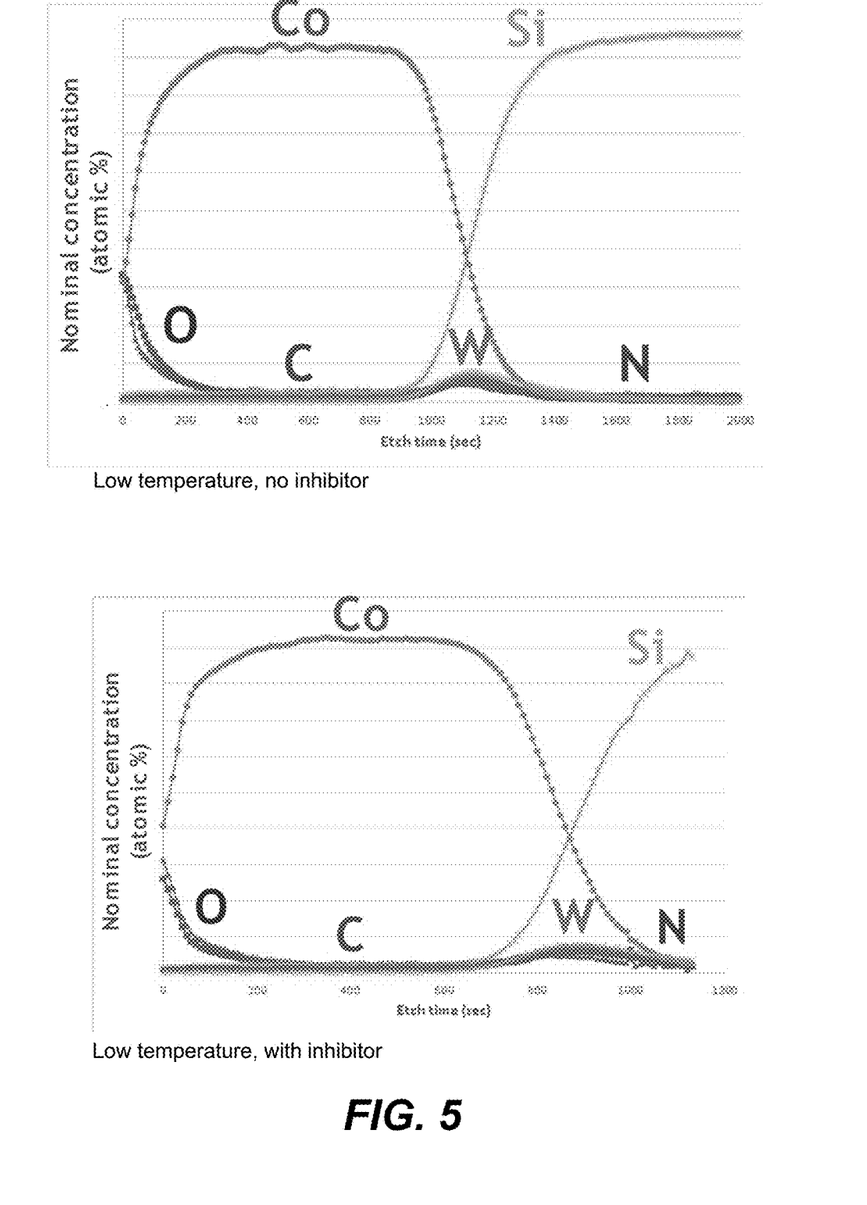
FIG. 5 shows x-ray photoelectron spectra for cobalt films deposited by ALD with and without inhibitor exposure.

Pure and crystalline ALD cobalt films were obtained by ALD using NH$_3$ inhibitor exposure with film resistivity at approximately 12 µohm-cm at 25 nm, which is comparable to that of CCTBA, using a precursor according to structures I and II. This indicates that the nitrogen of the NH$_3$ inhibitor is not incorporated into the film. FIG. 5 shows x-ray photoelectron spectra for cobalt films deposited by ALD with and without inhibitor exposure. The spectra show that there is negligible nitrogen impurities and similar carbon content for the two films. This indicates that there is no inhibitor-associated impurity incorporated into the film.

Apparatus

Figure 6:
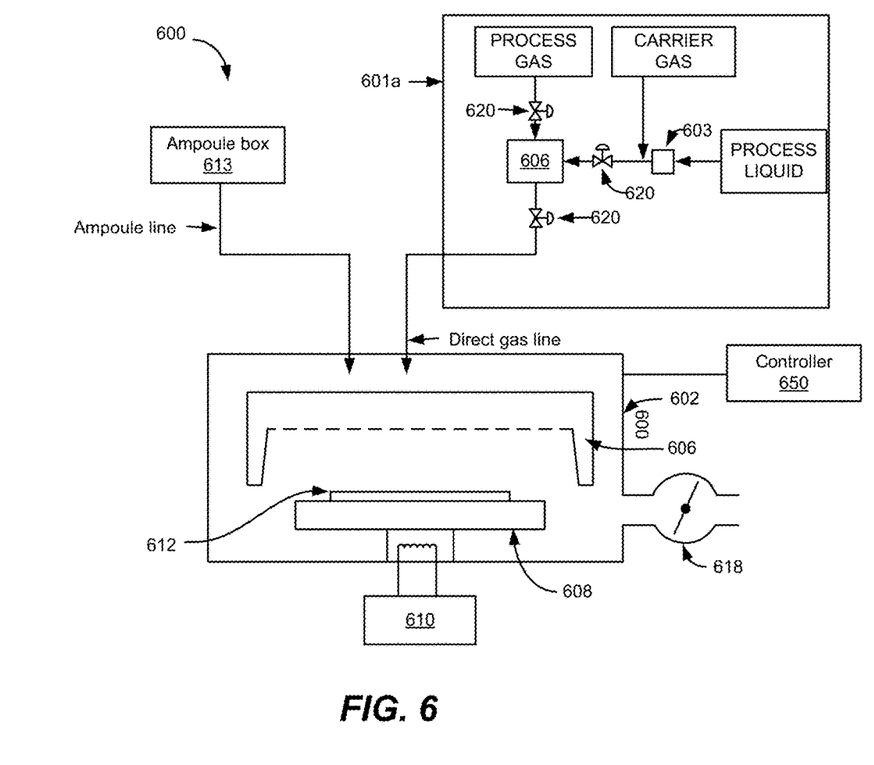
FIGS. 6 and 7 are schematic illustrations of processing apparatuses suitable for deposition processes in accordance with disclosed embodiments.
Figure 7:
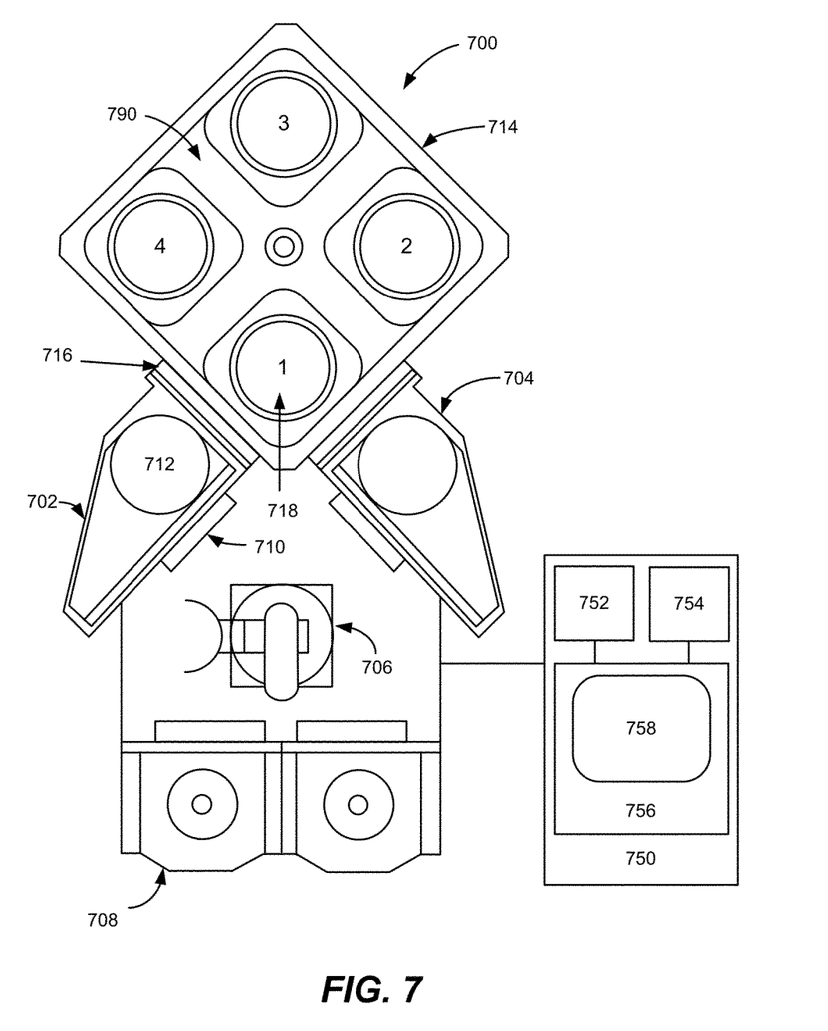

FIG. 6 depicts a schematic illustration of an embodiment of an ALD process station 600 having a process chamber 602 for maintaining a low-pressure environment. A plurality of ALD process stations may be included in a common low pressure process tool environment. For example, FIG. 7 depicts an embodiment of a multi-station processing tool 700. In some embodiments, one or more hardware parameters of ALD process station 600, including those discussed in detail below, may be adjusted programmatically by one or more computer controllers 650.

ALD process station 600 fluidly communicates with reactant delivery system 601a for delivering process gases to a distribution showerhead 606. Reactant delivery system 601a includes a mixing vessel 604 for blending and/or conditioning process gases, such as a cobalt precursor gas, hydrogen-containing gas, or nitrogen-containing gas, for delivery to showerhead 606. One or more mixing vessel inlet valves 620 may control introduction of process gases to mixing vessel 604. In various embodiments, deposition of a cobalt film is performed in process station 600 and in some embodiments, other operations such as barrier layer deposition or cobalt gap fill may be performed in the same or another station of the multi-station processing tool 700 as further described below with respect to FIG. 7.

As an example, the embodiment of FIG. 6 includes a vaporization point 603 for vaporizing liquid reactant to be supplied to the mixing vessel 604. In some embodiments, vaporization point 603 may be a heated vaporizer. In some embodiments, a liquid precursor or liquid reactant may be vaporized at a liquid injector (not shown). For example, a liquid injector may inject pulses of a liquid reactant into a carrier gas stream upstream of the mixing vessel 604. In one embodiment, a liquid injector may vaporize the reactant by flashing the liquid from a higher pressure to a lower pressure. In another example, a liquid injector may atomize the liquid into dispersed microdroplets that are subsequently vaporized in a heated delivery pipe. Smaller droplets may vaporize faster than larger droplets, reducing a delay between liquid injection and complete vaporization. Faster vaporization may reduce a length of piping downstream from vaporization point 603. In one scenario, a liquid injector may be mounted directly to mixing vessel 604. In another scenario, a liquid injector may be mounted directly to showerhead 606.

In some embodiments, a liquid flow controller (LFC) upstream of vaporization point 603 may be provided for controlling a mass flow of liquid for vaporization and delivery to process chamber 602. For example, the LFC may include a thermal mass flow meter (MFM) located downstream of the LFC. A plunger valve of the LFC may then be adjusted responsive to feedback control signals provided by a proportional-integral-derivative (PID) controller in electrical communication with the MFM. However, it may take one second or more to stabilize liquid flow using feedback control. This may extend a time for dosing a liquid reactant. Thus, in some embodiments, the LFC may be dynamically switched between a feedback control mode and a direct control mode. In some embodiments, this may be performed by disabling a sense tube of the LFC and the PID controller.

Showerhead 606 distributes process gases toward substrate 612. In the embodiment shown in FIG. 6, the substrate 612 is located beneath showerhead 606 and is shown resting on a pedestal 608. Showerhead 606 may have any suitable shape, and may have any suitable number and arrangement of ports for distributing process gases to substrate 612.

In some embodiments, pedestal 608 may be raised or lowered to expose substrate 612 to a volume between the substrate 612 and the showerhead 606. In some embodiments, pedestal 808 may be temperature controlled via heater 610. Pedestal 608 may be set to any suitable temperature, such as between about 25° C. and about 650° C. during operations for performing various disclosed embodiments. As described above, the pedestal temperature may be between 50° C. and 150° C., or 50° C. and 100° C. during ALD deposition of the cobalt film. It will be appreciated that, in some embodiments, pedestal height may be adjusted programmatically by a suitable computer controller 650. At the conclusion of a process phase, pedestal 608 may be lowered during another substrate transfer phase to allow removal of substrate 612 from pedestal 608.

In some embodiments, a position of showerhead 606 may be adjusted relative to pedestal 608 to vary a volume between the substrate 612 and the showerhead 606. Further, it will be appreciated that a vertical position of pedestal 608 and/or showerhead 606 may be varied by any suitable mechanism within the scope of the present disclosure. In some embodiments, pedestal 608 may include a rotational axis for rotating an orientation of substrate 612. It will be appreciated that, in some embodiments, one or more of these example adjustments may be performed programmatically by one or more suitable computer controllers 650. The computer controller 650 may include any of the features described below with respect to controller 750 of FIG. 9.

In some embodiments, instructions for a controller 650 may be provided via input/output control (IOC) sequencing instructions. In one example, the instructions for setting conditions for a process phase may be included in a corresponding recipe phase of a process recipe. In some cases, process recipe phases may be sequentially arranged, so that all instructions for a process phase are executed concurrently with that process phase. In some embodiments, instructions for setting one or more reactor parameters may be included in a recipe phase. For example, a first recipe phase may include instructions for setting a flow rate of an inert and/or a reactant gas (e.g., the first precursor such as a cobalt precursor), instructions for setting a flow rate of a carrier gas (such as argon), and time delay instructions for the first recipe phase. A second, subsequent recipe phase may include instructions for modulating or stopping a flow rate of an inert and/or a reactant gas, and instructions for modulating a flow rate of a carrier or purge gas and time delay instructions for the second recipe phase. A third recipe phase may include instructions for modulating a flow rate of a second reactant gas such as $H_2$ or $NH_3$, instructions for modulating the flow rate of a carrier or purge gas, instructions for igniting a plasma, and time delay instructions for the third recipe phase. A fourth, subsequent recipe phase may include instructions for modulating or stopping a flow rate of an inert and/or a reactant gas, and instructions for modulating a flow rate of a carrier or purge gas and time delay instructions for the fourth recipe phase. It will be appreciated that these recipe phases may be further subdivided and/or iterated in any suitable way within the scope of the present disclosure.

Further, in some embodiments, pressure control for process station 600 may be provided by butterfly valve 618. As shown in the embodiment of FIG. 6, butterfly valve 618 throttles a vacuum provided by a downstream vacuum pump (not shown). However, in some embodiments, pressure control of process station 600 may also be adjusted by varying a flow rate of one or more gases introduced to the process station 600.

As described above, one or more process stations may be included in a multi-station processing tool. FIG. 7 shows a schematic view of an embodiment of a multi-station processing tool 700 with an inbound load lock 702 and an outbound load lock 704, either or both of which may include a remote plasma source (not shown). A robot 706, at atmospheric pressure, is configured to move wafers from a cassette loaded through a pod 708 into inbound load lock 702 via an atmospheric port 710. A wafer (not shown) is placed by the robot 706 on a pedestal 712 in the inbound load lock 702, the atmospheric port 710 is closed, and the load lock inbound 702 is pumped down. Where the inbound load lock 702 includes a remote plasma source, the wafer may be exposed to a remote plasma treatment in the inbound load lock 702 prior to being introduced into a processing chamber 714. Further, the wafer also may be heated in the inbound load lock 702 as well, for example, to remove moisture and adsorbed gases. Next, a chamber transport port 716 to processing chamber 714 is opened, and another robot (not shown) places the wafer into the reactor on a pedestal of a first station shown in the reactor for processing. While the embodiment depicted in FIG. 7 includes load locks, it will be appreciated that, in some embodiments, direct entry of a wafer into a process station may be provided.

The depicted processing chamber 714 includes four process stations, numbered from 1 to 4 in the embodiment shown in FIG. 7. Each station has a heated pedestal (shown at 718 for station 1), and gas line inlets. It will be appreciated that in some embodiments, each process station may have different or multiple purposes. For example, in some embodiments, a process station may be switchable between an ALD and plasma-enhanced ALD process mode. In some embodiments, exposure to a deposition precursor and exposure to a second reactant and plasma are performed in the same station. Additionally or alternatively, in some embodiments, processing chamber 714 may include one or more matched pairs of ALD and plasma-enhanced ALD process stations. Further, exposure to a pre-treatment gas or plasma and an ALD process may occur in the same or different stations. While the depicted processing chamber 714 includes four stations, it will be understood that a processing chamber according to the present disclosure may have any suitable number of stations. For example, in some embodiments, a processing chamber may have five or more stations, while in other embodiments a processing chamber may have three or fewer stations.

FIG. 9 depicts an embodiment of a wafer handling system 790 for transferring wafers within processing chamber 714. In some embodiments, wafer handling system 790 may transfer wafers between various process stations and/or between a process station and a load lock. It will be appreciated that any suitable wafer handling system may be employed. Non-limiting examples include wafer carousels and wafer handling robots. FIG. 7 also depicts an embodiment of a system controller 750 employed to control process conditions and hardware states of process tool 700. System controller 750 may include one or more memory devices 756, one or more mass storage devices 754, and one or more processors 752. Processor 752 may include a CPU or computer, analog, and/or digital input/output connections, stepper motor controller boards, etc.

In some embodiments, system controller 750 controls all of the activities of process tool 700. System controller 750 executes system control software 758 stored in mass storage device 754, loaded into memory device 756, and executed on processor 752. Alternatively, the control logic may be hard coded in the controller 750. Applications Specific Integrated Circuits, Programmable Logic Devices (e.g., field-programmable gate arrays, or FPGAs) and the like may be used for these purposes. In the following discussion, wherever "software" or "code" is used, functionally comparable hard coded logic may be used in its place. System control software 758 may include instructions for controlling the timing, mixture of gases, gas flow rates, chamber and/or station pressure, chamber and/or station temperature, plasma exposure duration, UV radiation duration, wafer temperature, target power levels, RF power levels, substrate pedestal, chuck and/or susceptor position, and other parameters of a particular process performed by process tool 700. System control software 758 may be configured in any suitable way. For example, various process tool component subroutines or control objects may be written to control operation of the process tool components used to carry out various process tool processes. System control software 758 may be coded in any suitable computer readable programming language.

In some embodiments, system control software 758 may include input/output control (IOC) sequencing instructions for controlling the various parameters described above. Other computer software and/or programs stored on mass storage device 754 and/or memory device 756 associated with system controller 750 may be employed in some embodiments. Examples of programs or sections of programs for this purpose include a substrate positioning program, a process gas control program, a pressure control program, a heater control program, and a plasma control program.

A substrate positioning program may include program code for process tool components that are used to load the substrate onto pedestal 718 and to control the spacing between the substrate and other parts of process tool 700.

A process gas control program may include code for controlling gas composition (e.g., cobalt precursor gases, co-reactant gases, inhibitor gases, and purge gases as described herein) and flow rates and optionally for flowing gas into one or more process stations prior to deposition in order to stabilize the pressure in the process station. A pressure control program may include code for controlling the pressure in the process station by regulating, for example, a throttle valve in the exhaust system of the process station, a gas flow into the process station, etc.

A heater control program may include code for controlling the current to a heating unit that is used to heat the substrate. Alternatively, the heater control program may control delivery of a heat transfer gas (such as helium) to the substrate.

A pressure control program may include code for maintaining the pressure in the reaction chamber in accordance with the embodiments herein.

In some embodiments, there may be a user interface associated with system controller 750. The user interface may include a display screen, graphical software displays of the apparatus and/or process conditions, and user input devices such as pointing devices, keyboards, touch screens, microphones, etc.

In some embodiments, parameters adjusted by system controller 750 may relate to process conditions. Non-limiting examples include process gas composition and flow rates, temperature, pressure, etc. These parameters may be provided to the user in the form of a recipe, which may be entered utilizing the user interface.

Signals for monitoring the process may be provided by analog and/or digital input connections of system controller 750 from various process tool sensors. The signals for controlling the process may be output on the analog and digital output connections of process tool 700. Non-limiting examples of process tool sensors that may be monitored include mass flow controllers, pressure sensors (such as manometers), thermocouples, etc. Appropriately programmed feedback and control algorithms may be used with data from these sensors to maintain process conditions.

System controller 750 may provide program instructions for implementing the above-described deposition processes. The program instructions may control a variety of process parameters, such as pressure, temperature, etc. The instructions may control the parameters to operate in-situ deposition of film stacks according to various embodiments described herein.

The system controller 750 will typically include one or more memory devices and one or more processors configured to execute the instructions so that the apparatus will perform a method in accordance with disclosed embodiments. Machine-readable media containing instructions for controlling process operations in accordance with disclosed embodiments may be coupled to the system controller 750.

In some implementations, the system controller 750 is part of a system, which may be part of the above-described examples. Such systems can include semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The system controller 750, depending on the processing conditions and/or the type of system, may be programmed to control any of the processes disclosed herein, including the delivery of processing gases, temperature settings (e.g., heating and/or cooling), pressure settings, vacuum settings, flow rate settings, fluid delivery settings, positional and operation settings, wafer transfers into and out of a tool and other transfer tools and/or load locks connected to or interfaced with a specific system.

Broadly speaking, the system controller 750 may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the system controller 750 in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The system controller 750, in some implementations, may be a part of or coupled to a computer that is integrated with, coupled to the system, otherwise networked to the system, or a combination thereof. For example, the system controller 750 may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the system controller 750 receives instructions in the form of data, which specify parameters for each of the processing steps to be performed during one or more operations. It should be understood that the parameters may be specific to the type of process to be performed and the type of tool that the system controller 750 is configured to interface with or control. Thus as described above, the system controller 750 may be distributed, such as by including one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber. While FIGS. 6 and 7 provide examples of chambers and tools that may be used to perform the methods disclosed herein, various modifications may be made.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an ALD chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the system controller 750 might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

CONCLUSION

Although the foregoing embodiments have been described in some detail for purposes of clarity of understanding, it will be apparent that certain changes and modifications may be practiced within the scope of the appended claims. It should be noted that there are many alternative ways of implementing the processes, systems, and apparatus of the present embodiments. Accordingly, the present embodiments are to be considered as illustrative and not restrictive, and the embodiments are not to be limited to the details given herein.

What is claimed is:

1. A method comprising:
providing a substrate having one or more features, each feature comprising a feature opening; and performing multiple deposition cycles to deposit a cobalt layer that is conformal to the one or more features, wherein each deposition cycle comprises:
exposing the feature to a dose of a cobalt precursor to form a layer of adsorbed cobalt precursor on the one or more features;
exposing the layer of adsorbed cobalt precursor to a dose of a co-reactant to react with the cobalt precursor in the layer of adsorbed cobalt precursor on the one or more features; and
exposing the feature to a dose of a mixture of the co-reactant and a nitrogen-containing cobalt growth inhibitor.

2. The method of claim 1, wherein exposing the layer of adsorbed cobalt precursor to the dose of the co-reactant to react with the cobalt precursor in the layer of adsorbed cobalt precursor on the one or more features is performed prior to exposing the feature to the dose of the mixture of the co-reactant and the nitrogen-containing cobalt growth inhibitor.

3. The method of claim 1, wherein exposing the layer of adsorbed cobalt precursor to the dose of the co-reactant to react with the cobalt precursor in the layer of adsorbed cobalt precursor on the one or more features is performed after exposing the feature to the dose of the mixture of the co-reactant and the nitrogen-containing cobalt growth inhibitor.

4. The method of claim 1, wherein the cobalt precursor has a structure according to (I):

where $R^1$ is $C_1$-$C_8$-alkyl, $R^2$ is $C_1$-$C_8$ alkyl, x is zero, 1 or 2; and y is zero or 1.

5. The method of claim 1, wherein the cobalt precursor has a structure according to (II)

6. The method of claim 1, wherein the cobalt precursor is selected from the group consisting of dicarbonyl cyclopentadienyl cobalt, cobalt carbonyl, a cobalt amidinate precursor, a cobalt diazadienyl complex, and a cobalt amidinate/guanidinate precursor.

7. The method of claim 1, wherein the substrate temperature during the multiple deposition cycles is maintained at a temperature no more than 150° C.

8. The method of claim 1, wherein the substrate temperature during the multiple deposition cycles is maintained at a temperature no more than 100° C.

9. The method of claim 1, wherein the substrate temperature during the multiple deposition cycles is maintained at a temperature no more than 90° C.

10. The method of claim 1, wherein the cobalt layer is deposited on a barrier layer.

11. The method of claim 1, wherein the co-reactant is hydrogen ($H_2$).

12. The method of claim 1, wherein the co-reactant is hydrogen ($H_2$) and the nitrogen-containing cobalt growth inhibitor is ammonia ($NH_3$).

13. The method of claim 12, wherein $NH_3$ is between 0.5% and 20% (volumetric) of the mixture.

14. The method of claim 12, wherein $NH_3$ is between 0.5% and 5% (volumetric) of the mixture.

15. The method of claim 1, wherein each cycle further comprises purging a chamber in which the substrate is housed after exposing the feature to the dose of the cobalt precursor and prior to exposing the layer of adsorbed cobalt precursor to the dose of the co-reactant.

16. The method of claim 1, wherein each cycle further comprises purging a chamber in which the substrate is housed after exposing the feature to the dose of a mixture of the co-reactant and the nitrogen-containing cobalt growth inhibitor.

17. The method of claim 1, wherein there is no purge between exposing the feature to the dose of the co-reactant and exposing the feature to the dose of the mixture of the co-reactant and the nitrogen-containing cobalt growth inhibitor.

18. A method comprising:
(a) introducing a dose of a cobalt precursor to a process chamber;
(b) after introducing the dose of the cobalt precursor, purging the process chamber;
(c) after purging the process chamber, introducing a dose of a $H_2$ co-reactant;
(d) after introducing the dose of the $H_2$ co-reactant, introducing a dose of a mixture of the $H_2$ co-reactant and a nitrogen-containing compound, wherein the nitrogen-containing compound is between 0.5% and 20% (volumetric) of the total of the $H_2$ co-reactant and the nitrogen-containing compound;
(e) after introducing the dose of the mixture of the $H_2$ co-reactant and a nitrogen-containing compound, purging the process chamber; and
repeating (a)-(e) one or more times.

19. An apparatus comprising:
a process chamber;
one or more gas inlets into the process chamber and associated flow-control hardware; and
a controller having at least one processor and a memory, wherein the at least one processor and the memory are communicatively connected with one another, the at least one processor is at least operatively connected with the flow-control hardware, and the memory stores computer-executable instructions for:
(a) introducing a dose of a cobalt precursor to the process chamber;
(b) after introducing the dose of the cobalt precursor, purging the process chamber;
(c) after purging the process chamber, introducing a dose of a $H_2$ co-reactant;
(d) after introducing the dose of the $H_2$ co-reactant, introducing a dose of a mixture of the $H_2$ co-reactant and a nitrogen-containing compound, wherein the nitrogen-containing compound is between 0.5% and 20% (volumetric) of the total of the $H_2$ co-reactant and the nitrogen-containing compound;
(e) after introducing the dose of the mixture of the $H_2$ co-reactant and a nitrogen-containing compound, purging the process chamber; and
repeating (a)-(e) one or more times.

\* \* \* \* \*